United States Patent [19]
Zappe

[11] 3,936,809
[45] Feb. 3, 1976

[54] SINGLE FLUX QUANTUM STORAGE DEVICES AND SENSING MEANS THEREFOR

[75] Inventor: Hans H. Zappe, Granite Springs, N.Y.

[73] Assignee: International Business Machines Corporation, Armonk, N.Y.

[22] Filed: June 7, 1974

[21] Appl. No.: 477,387

[52] U.S. Cl. .............. 340/173.1; 307/212; 307/306
[51] Int. Cl.² ........................................ G11C 11/44
[58] Field of Search .......... 340/173.1; 307/212, 306

[56] References Cited
UNITED STATES PATENTS
3,705,393  12/1972  Anacker et al. ................ 340/173.1

Primary Examiner—Terrell W. Fears
Attorney, Agent, or Firm—Thomas J. Kilgannon, Jr.

[57] ABSTRACT

An information storage device which stores a single flux quantum without bias is disclosed. The device includes a single Josephson tunneling device made from two superconductive materials spaced apart by an insulator wherein a Josephson current density profile $J_1(x)$ defined by $$J_1(x) = \int_{-\infty}^{+\infty} J_1(x,y) dy$$

is characterized such that the profile has a larger magnitude at the boundary portions of said device than at the center. The current density profile is controlled by adjusting either the oxide thicknesses, the work function of the superconductors or by changing the shape of the junction from its usual rectangular cross-section.

A sensing arrangement for the above described storage devices is also disclosed. By controlling the damping of the above described structures, the gain characteristics and the vortex characteristics are adjusted to permit coincident selection of a single device. The overall reduction in the magnitude of the Josephson current density profile provides a higher junction resistance with a consequent decrease in damping. This increase in resistance across the tunneling junction unexpectedly extends the switching characteristic from the envelope boundary of all vortex modes to the extent that the application of the same coincident currents permits the unambiguous reading of both positive and zero or negative vortices. Each device during sensing acts as its own sense detector and is capable of switching to the voltage state if a flux quantum is stored. A bit-organized memory array utilizing the devices disclosed is also shown.

45 Claims, 11 Drawing Figures

LOW Rj
LARGE DAMPING

LARGE Rj
LOW DAMPING

SINGLE FLUX QUANTUM STORAGE DEVICES AND SENSING MEANS THEREFOR

BACKGROUND OF THE INVENTION

1. Field of the Invention

This invention relates generally to Josephson tunneling storage devices for use in DRO (Destructive Read Out) random access memory arrays. More specifically, it relates to Josephson tunneling devices which are capable of storing binary information in the form of a single flux quantum. Still more specifically, it relates to single flux quantum Josephson tunneling storage devices which are capable of storing a single flux quantum in the absence of applied bias or at zero applied field. Still more specifically, it relates to a single flux quantum Josephson tunneling storage device in which writing and sensing is performed with coincident currents. Each device during sensing acts as its own sense detector and is capable of switching to the voltage state if a flux quantum is stored. The ability to store a single flux quantum at zero bias is determined by controlling the Josephson current density profile across the junction which, in turn, permits the storing of binary information without the need for external loops or circuits which normally carry circulating currents. Sensing uses the fact that the gain characteristics of the junction have their switching thresholds extended by increasing the junction resistance across the entire Josephson junction. The use of such single flux quantum storage devices permits the fabrication of very high density arrays having extremely fast switching times which require no ultrahigh sensitivity circuits to sense a stored signal.

2. Description of the Prior Art

The principle of Josephson current devices is understood in the prior art, and such devices have been proposed for memory applications. In particular, reference is made to U.S. Pat. No. 3,626,391 issued Dec. 7, 1971, in the name of W. Anacker and assigned to the same assignee as the present invention. In that patent, a memory array is described which includes a plurality of Josephson tunneling devices wherein each memory cell is comprised of two such Josephson devices. The state of each memory cell is determined by the direction of the circulating current in the cell.

In two technical papers, a superconducting ring containing a barrier such as a Josephson junction is studied. In particular, the reaction of superconducting rings having weak links therein to the application of external magnetic fields has been reported by F. Block in a paper entitled "Simple Interpretation of the Josephson Effect", which appears in *Physical Review Letters*, Vol. 21, No. 17, Oct. 21, 1968 on page 241. The paper discusses the Josephson effect in terms of a superconducting ring wherein the ring is linked with an external magnetic field. In another article by D. E. McCumber appearing in *Journal of Applied Physics*, Vol. 39, No. 6, May 1968, page 2503, superconductor weak link junctions and the effect of magnetic fields on these junctions is discussed. On page 2507 of this article, McCumber describes a superconducting loop containing a single weak link and mentions that this configuration has potential utility as a memory element.

U.S. Pat. No. 3,705,393 issued Dec. 5, 1972, in the names of W. Anacker and H. H. Zappe and assigned to the same assignee as the present invention, describes a superconducting memory array wherein the memory cells are superconducting rings each of which has at least one element therein capable of supporting Josephson tunneling current. In the patent, coincident currents are used to trap flux in the rings and to release the trapped flux for readout of the memory cells. Fast operation and tolerable limits on drive currents are indicated as being obtainable if single flux quantum operation is utilized. To achieve single flux quantum operation, the capacitance, inductance, and damping of each memory cell must be within certain limits.

In 1970, P. W. Anderson, in an article in *Physics Today*, Vol. 23, page 29 (1970), described a flux shuttle which is a single vortex shift register. The first experimental results on the flux shuttle were recently reported by T. A. Fulton and L. N. Dunkelberger in an article in *Applied Physics Letters*, Vol. 22, page 232 (1973). In the devices of the articles and the last mentioned patent, flux is stored either in small superconductive inductances in the form of loops containing one Josephson junction or in single rectangular junctions which require an external bias field. Reading is performed by sensing the signal induced into the array lines during the release of the trapped fluxoid. Although very high packing densities are possible with such schemes, their disadvantage is that the energy released for reading is of the order of only $10^{-18}$ joules. Also, since the fabrication of the prior art arrangements are relatively large due to the requirement for loops, such arrangements do not provide the ultimate in small size, high speed devices which is the direction towards which most present-day technologies are tending. In addition, none of the known arrangements provide a device which is its own sense detector switching the device to the gap voltage if a flux quantum is stored.

SUMMARY OF THE INVENTION

A Josephson junction device for storing at least a single flux quantum in the absence of an external magnetic field, in its broadest aspect, comprises first and second superconductive elements disposed in an $x$, $y$ plane; an insulation layer of thickness sufficient to permit Josephson tunneling disposed between the elements and, means integral with at least one of said elements and said layer for generating a current density profile defined by $$J_1(x) = \int_{-\infty}^{+\infty} J_1(x,y) dy,$$

where $x$ is the length dimension, and $y$ is the width dimension, such that the profile $J_1(x)$ has a larger magnitude at the boundary portions of said device than at the center portion of said device.

In accordance with the broadest aspects of the invention, a Josephson junction device is provided which includes means integral with said device for increasing the junction resistance of the device to reduce the damping of the device.

In accordance with the broader aspects of the invention, a Josephson junction device is provided which includes means disposed in electrically coupled relationship for writing information stored in the device first mentioned hereinabove and for writing and reading in the device having reduced damping.

In accordance with broader aspects of the present invention, the means for generating the current density profile includes a portion of each of the superconductive elements disposed in overlapping relationship, at least a portion of the extremity of at least one of the superconductive elements extending toward the other to provide a narrower tunneling region at the center of the device than at the boundaries of the device.

In accordance with still broader aspects of the present invention, the means for increasing the Josephson junction resistance includes the insulation layer of the device all portions of which are of a thickness greater than the first mentioned thickness; the greater thickness being such that Josephson tunneling occurs along the length of said junction in accordance with $J_i(x)$ but is of decreased magnitude everywhere along the length of the junction.

In accordance with more particular aspects of the present invention, said at least a portion of the extremity of at least one of said elements extending toward the other forms a tapered notch, a rectilinear notch or a curvilinear notch.

In accordance with more specific aspects of the present invention, the means for reading the device of reduced damping includes means connected to the device and the control element for switching said device to the voltage state for one stored binary condition and for maintaining said device in an unchanged state for another stored binary condition.

In accordance with still more specific aspects of the present invention, a Josephson junction device for storing a single flux quantum in the absence of an external magnetic field is provided which comprises an interferometer device which includes at least two spaced apart Josephson junctions each of which is capable of supporting tunneling via an insulation layer of thickness sufficient to support tunneling. The device has a current density profile defined by $$J_1(x) = \int_{-\infty}^{+\infty} J_1(x,y)dy$$

such that the profile $J_1(x)$ has a given magnitude at the spaced apart junctions and zero magnitude between the spaced apart junctions. Further included is means integral with the device for increasing the junction resistance of the Josephson junctions to reduce the damping of said device.

In accordance with still more specific aspects of the present invention, the means for increasing the junction resistance includes an insulation layer of thickness greater than the above mentioned thickness; the greater thickness being such that Josephson tunneling occurs in accordance with $J_1(x)$ but is of decreased magnitude through the Josephson junctions. Writing and reading means are also provided for storing and recovering information from the above mentioned interferometer arrangement.

It is, therefore, an object of this invention to provide a single flux quantum storage device which is capable of storing at least a single flux quantum at zero bias.

Another object is to provide a single flux quantum storage device in which the Josephson current density is reduced by providing higher junction resistance and, therefore, lower damping.

Another object is to provide a Josephson junction memory element which does not require an associated superconducting loop for storage.

Still another object is to provide a memory array having very low power dissipation and very high speed switching operation.

Still another object is to provide a single flux quantum storage element which acts as its own sense detector and switches to the voltage state if a flux quantum is stored upon the application of coincident currents.

The foregoing and other objects, features and advantages of the invention will become apparent from the following more particular description of the preferred embodiment of the invention as illustrated in the accompanying drawings.

DESCRIPTION OF PREFERRED EMBODIMENTS

Figure 1:
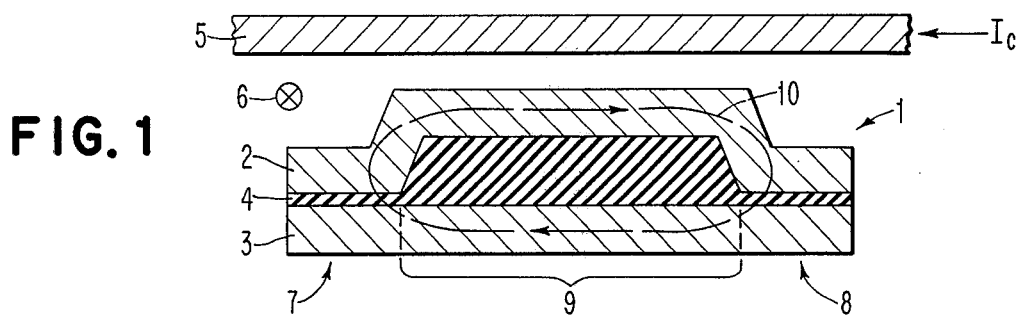
FIG. 1 is a partial cross-sectional view of a device in accordance with the teaching of the present invention which is capable of storing a single flux quantum at zero bias. The device shown has a single rectangular Josephson junction having an insulator disposed between superconductive elements wherein the insulator is of such thickness that it is capable of supporting Josephson tunneling along the length of the junction.

Referring now to FIG. 1, there is shown therein a partial cross-sectional view of a rectangular Josephson junction device 1 which is capable of storing a single flux quantum at zero bias or in the absence of an externally applied magnetic field. Josephson junction device 1 consists of superconducting elements 2,3 which are spaced apart by a dielectric or insulator 4 which has a thickness across the device which permits tunneling therethrough. Superconducting elements 2,3 may be formed of any superconductive material well known to those skilled in the cryogenic arts, such as lead, niobium, tin or aluminum. Dielectric 4 may also be formed from any dielectric or insulator well known to those skilled in the cryogenic arts such as silicon dioxide or oxide of the metal being used and, as indicated hereinabove, its thickness should not be so great as to prevent Josephson tunneling therethrough. A control line 5 which is disposed in orthogonal, overlying relationship and spaced from superconducting element 1 by an insulator (not shown) provides control current ($I_c$) which, in combination with current applied to elements 2,3 stores or reads out information held in device 1 in the form of current vortices or a zero current vortex. Thus, currents ($I_c$) and ($I_g$) are coincidentally applied to control line 5 and superconductive elements 2,3 to both write and read information into and from device 1. In FIG. 1, ($I_g$) may be applied to superconductive element 2 in a direction indicated by circled cross 6 which is also the direction of applied magnetic field due to current flow in control line 5.

Current vortices can be formed inside long Josephson junctions by applying an external magnetic field of the order of or larger than $I_m(0)$. However, these vortices are not stable in zero magnetic field. The reason is that the Lorentz force resulting from the self-field of a vortex pushes the circulating Josephson currents outward.

To maintain a stable vortex inside a device similar to that shown in FIG. 1, the energy associated with the (inductive) Josephson current must be larger at the junction edges than the energy resulting from the Lorentz force. This can be accomplished by increasing the Josephson threshold current at two opposing junction ends by locally increasing the Josephson current density or by providing greater junction widths at the opposing junction ends than at the center. This latter approach will be discussed hereinbelow in more detail in conjunction with FIGS. 2A, 3A and 4A. In any event, the Josephson current density profile is such that it has a greater magnitude at the boundaries of device 1 than at the center of device 1. One way of achieving the desired Josephson current density profile is shown in FIG. 1. Thus, insulation 4 is thinner at the ends 7,8 of device 1 than at centrally disposed region 9. In this way, device 1 is a device with a single rectangular Josephson tunneling junction having a dielectric or insulator 4 disposed between superconductive elements 2,3 which supports Josephson tunneling along the length of the junction. It should be appreciated that, under such circumstances, the device of FIG. 1 is distinguishable over the known interferometer devices which consist of a pair of Josephson tunneling junctions. By providing a higher current density at the ends of a single Josephson junction device which is generally represented by $$J_1(x) = \int_{-\infty}^{+\infty} J_1(x,y)dy,$$

and having a greater current density at the boundaries than at the center of the device, current vortices corresponding to a single flux quantum can be entered into device 1 of FIG. 1 by a suitable combination of gate current ($I_g$) and control current ($I_c$). The magnetic field necessary to generate a vortex is produced by control line 5. The device current which opposes the penetration of the external control field ultimately forms the vortex shown by the dashed arrow 10 in FIG. 1. Thus, when a vortex is formed in device 1 of FIG. 1, it remains stable in the absence of an external magnetic field whereas, in the prior art single junction devices, an external bias or magnetic field was required to maintain the current vortices formed in a stable state.

The Josephson current density profile mentioned hereinabove may be provided in other ways than by controlling the thickness of dielectric layer 4 at the boundaries of device 1. Thus, the end portions 7,8 of device 1 which contain the boundary portions of superconductive elements 2,3 may also be utilized to provide the desired current density profile. Under such circumstances, device 1 of FIG. 1 has a dielectric or insulator 4 of uniform thickness while the boundary portions of superconductor elements 2,3 at ends 7,8 utilize a metal having a different work function from the metal utilized for the portions of superconducting elements 2,3 in centrally disposed region 9. Specifically, the work function of the metal at the boundary portions of device 1 is lower than the work function of that portion of conductors 2,3 associated with centrally disposed region 9. By lowering the work function of those portions of superconductive elements 2,3 associated with end regions 7,8, a Josephson current density distribution is obtained which has a greater magnitude in those portions of device 1 associated with end regions 7,8 than in those portions of device 1 associated with centrally disposed region 9. Thus, where centrally disposed region 9 is made of lead, regions 7,8 may be fabricated from a lower work function metal such as tin. The resulting device has the desired Josephson current density profile, fulfills the criterion of being a single Josephson junction device and requires no external bias or magnetic field to maintain a stored single flux quantum in a stable condition.

Figure 2A:
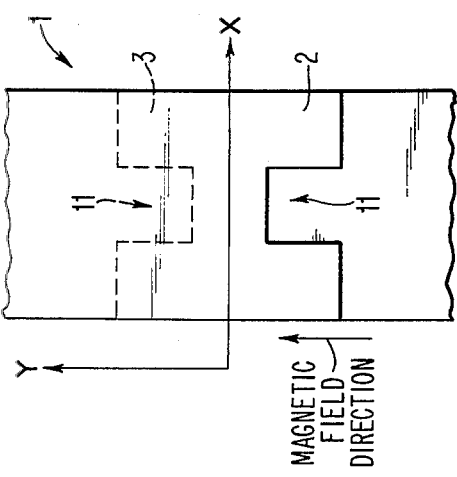
FIG. 2A is a plan view of a Josephson junction device in accordance with the teaching of the present invention wherein a desired Josephson current density profile $J_1(x)$ is provided by causing the extremities of the superconductive elements to extend toward each other in the form of rectilinear notches. Broadly speaking, the figure shows a centrally disposed necked down region which provides a Josephson current density profile which has a larger magnitude at the boundary portions of the device than at the center portion of said device.

The criterion that a Josephson junction device exhibit a Josephson current density profile such that the profile has a larger magnitude at the boundary portions of the device than at the center portion of the device can be achieved with uniform dielectric thickness and single work function metals by shaping the junctions. Stated another way, the desired Josephson current density profile may be generated by causing at least a portion of the extremity of at least one of the elements 2,3 which are disposed in overlapping relationship to extend toward the other to provide a narrower tunneling region at the center of device 1 than at the boundaries of device 1. FIGS. 2A–4A show plan views of such structures which provide desired Josephson current density profiles as shown in FIGS. 2B–4B, respectively. Referring now to FIG. 2A, there is shown therein a plan view of a single Josephson junction device 1 wherein a portion of the extremity of each of the elements 2,3 extends toward the other to form a rectilinear notch 11 in each of the superconductive elements 2,3. In FIG. 2A, it should be appreciated that a dielectric or insulator 4, although not shown, is disposed between elements 2,3 at their places of overlap. As can be seen from a consideration of FIG. 2B, which shows the Josephson current density profile along the length of the Josephson junction of device 1 or in the $x$ direction, device 1 has a Josephson current density profile $J_1(x)$, which has a greater magnitude at the boundaries of device 1 than at the center of device 1.

Figure 3A:
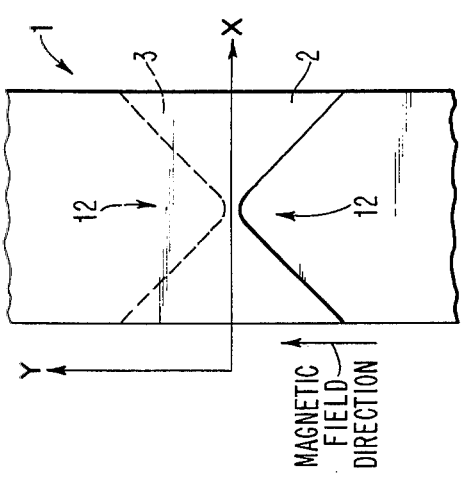
FIG. 3A is a plan view of a Josephson junction device which provides a Josephson current density profile in accordance with the teachings of the present invention by forming tapered notches in the superconductive elements which form the Josephson junction device.
Figure 4A:
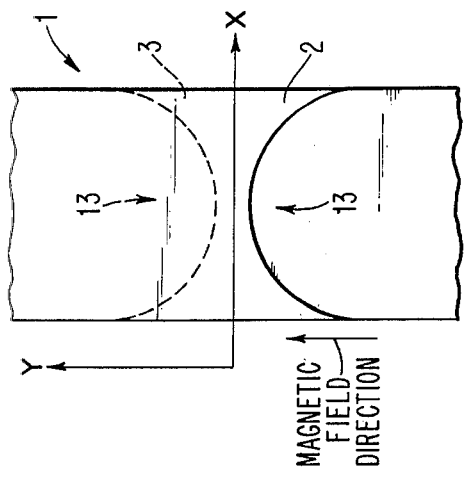
FIG. 4A is a plan view of a Josephson device in accordance with the teaching of the present invention wherein the extremities of the superconducting elements extend toward each other in such a way as to form a curvilinear notch or "dumbbell" shaped junction.
Figure 2B:
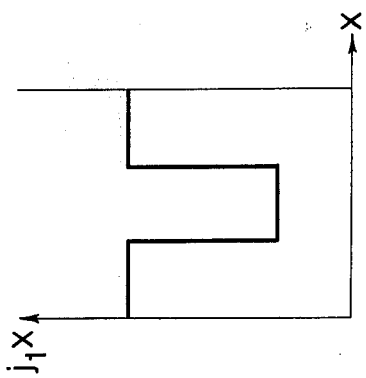
FIG. 2B is a graphical representation of the Josephson current density profile, $J_1(x)$, along the length of the Josephson junction obtained using the configuration shown in FIG. 2A.
Figure 3B:
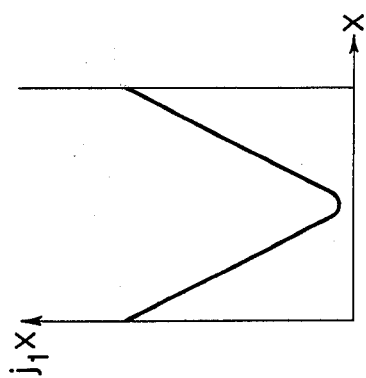
FIG. 3B is a graphical representation of the Josephson current density profile obtained using the tapered notch arrangement of FIG. 3A.
Figure 4B:
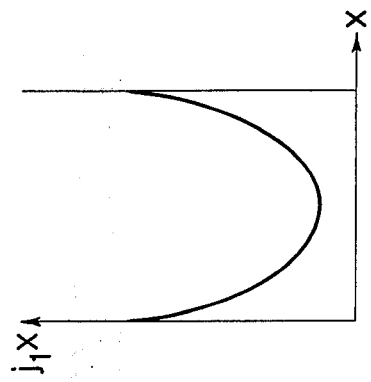
FIG. 4B shows the Josephson current density profile obtained utilizing the arrangement of FIG. 4A.

Similarly, in FIGS. 3A and 4A, which show tapered notches 12 and curvilinear notches 13, respectively, in the extremities of superconducting elements 2,3, their Josephson current density profiles $J_1(x)$, also have greater magnitudes at the boundary portions of device 1 than at the center portions of device 1. As with device 1 of FIG. 2A, devices 1 of FIGS. 3A, 4A also have dielectrics or insulators disposed between elements 2,3 at their places of overlap. Each of the devices just described has the desired Josephson current density profile as a result of what may be generally described as a centrally disposed necked-down region. Thus, as a general rule, the shape of the Josephson junction may take any form provided the resulting structure has a centrally disposed necked-down region. It should be appreciated, at this point, that it is not necessary to have both of the extremities of superconducting elements 2,3 extend toward each other to form the centrally disposed necked-down region but that only one of the extremities of conductors 2,3 need extend toward the other extremity. Thus, in FIG. 2A, rectilinear notch 11 in element 3 may be eliminated without changing the ultimate Josephson current density profile. The only change required is to have notch 11 of element 2 extend in the $y$ direction until it substantially overlaps the extremity of the now unnotched element 3. Similarly, in the tapered and curvilinear notch embodiments of FIG. 3A and FIG. 4A, respectively, only one of the elements 2,3 need have the tapered notch 12 or curvilinear notch 13. With respect to FIGS. 2A–4A, it should be appreciated that in actual operation a control line 5 is disposed over each of the Josephson junctions shown which, when a control current, $I_c$, is applied, provides a magnetic field in the direction shown by the arrow in each of the FIGS. 2A–4A. In all of the embodiments shown, dielectric or insulator 4 need only have a minimum thickness which is sufficient to support Josephson tunneling along the length of the junction. Adhering to this criterion in combination with the other parameters described hereinabove permits the generation of the desired Josephson current density profile and the resulting devices are capable of storing a single flux quantum in the absence of an externally applied magnetic field or at zero bias.

Figure 5:
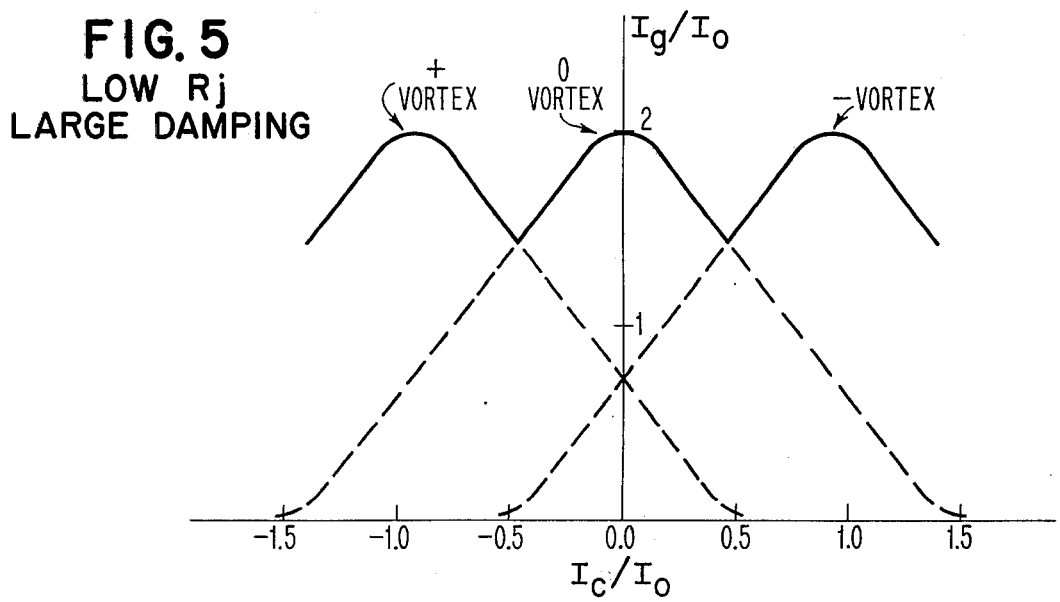
FIG. 5 is a graphical representation of a set of threshold curves of gate current ($I_g$) versus control current ($I_c$) both normalized to ($I_0$) for a device similar to that shown in FIG. 1 with the exception that the curves represent a device having low junction resistance ($R_j$) which results in a device having large damping. Switching to the voltage state occurs if the applied currents cross a solid line segment of the curves. Also, a change from one quantum state to another occurs if the applied currents cross a dashed line segment of the curves.

Using the devices shown in FIGS. 1 and 2A–4A, a threshold characteristic having the general form of that shown in FIG. 5 can be obtained by plotting the variation of gate current, ($I_g$), with respect to control current, ($I_c$). In FIG. 5, each of the parameters ($I_g$), ($I_c$) is plotted normalized with respect to ($I_0$). In FIG. 5, the zero vortex curve which relates to a device having low junction resistance, $R_j$, and therefore, large damping, is disposed symmetrically about the $I_g/I_0$ axis and having values of ±1.5 or $I_c/I_0$ when $I_g$ is 0. Thus, for a device not containing a vortex any combination of control current, ($I_c$), and gate current, ($I_g$), which remain inside the zero vortex curve, no vortex can be formed in the devices described hereinabove. If the combination of these currents is such that the operating point of the device is brought outside the heavy line portion of the zero vortex curve, the device switches from the superconducting state to the voltage state in the usual manner of Josephson junction devices. Also, if the combination of applied currents shifts the operating point of the associated device so that it crosses a dashed portion of the zero vortex curve, the device stores a plus or minus vortex. Under such circumstances, a Josephson junction device is capable of storing a single flux quantum which may have one of two possible current vortex directions as indicated by the references in FIG. 5 to plus (+) vortex and minus (−) vortex. Once a device has changed from one vortex mode to another, the vortex mode from which the device has changed no longer exists and, accordingly, its threshold characteristic in that mode no longer exists. Thus, in FIG. 5, if the combination of currents applied changes the device operating point from a zero vortex mode to a plus vortex mode by crossing the dashed line of the zero vortex mode, the zero vortex mode disappears and only the plus vortex threshold characteristic exists. As long as the combination of currents applied remains within the plus vortex mode threshold characteristic, the associated device is capable of storing a single flux quantum. Where the combination of currents applied causes the heavy line portion of any of the vortex modes to be crossed, the associated device switches into the voltage state. Also, if the combination of currents applied to the device when it is storing a single flux quantum is such that the dashed line portion of the plus vortex mode threshold characteristic is crossed, the device changes from a plus vortex mode back to the zero vortex mode and, a single flux quantum can no longer be stored. From the foregoing, it should be clear that combinations of gate and control currents can be applied to a device such that the device will store either a zero or positive vortex which are representative of binary zero and binary one conditions, respectively. This can be achieved, in the usual case, by applying coincident gate and control currents of such a value that either a zero vortex or a positive vortex is stored in the associated device. When, however, the information stored is to be read, the application of coincident currents produces an output current in the gate line when a positive vortex is stored and no current when a zero or negative vortex is stored. For example, if a binary one is stored in the form of a positive vortex, the application of coincident currents causes the dashed line portion of the positive vortex curve to be crossed causing the release of the stored vortex and the operating point of device 1 to change to the zero vortex mode. The released vortex having an energy of the order of $10^{-18}$ joules causes a small current pulse to be injected into the gate line associated with device 1. The same coincident currents applied when no vortex is stored produce no output since the dashed line portion of the zero vortex is not crossed. It should be recalled that when a zero vortex exists a positive vortex does not exist and vice versa.

Figure 6:
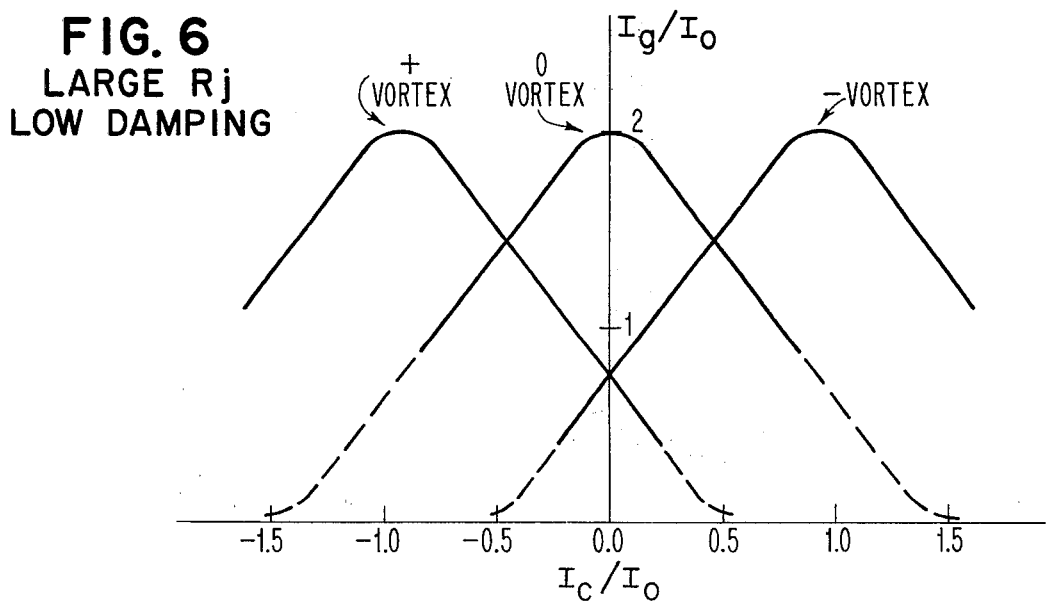
FIG. 6 is a graphical representation of a set of computed curves similar to that shown in FIG. 2 except that the curves show the ($I_g$) versus ($I_c$) characteristic normalized to ($I_0$) for a device having a high junction resistance ($R_j$) which results in a device having low damping. It is significant to note that the curves of FIG. 6 have their switching thresholds extended for all vortex states as a result of the increase in junction resistance.
Figure 7:
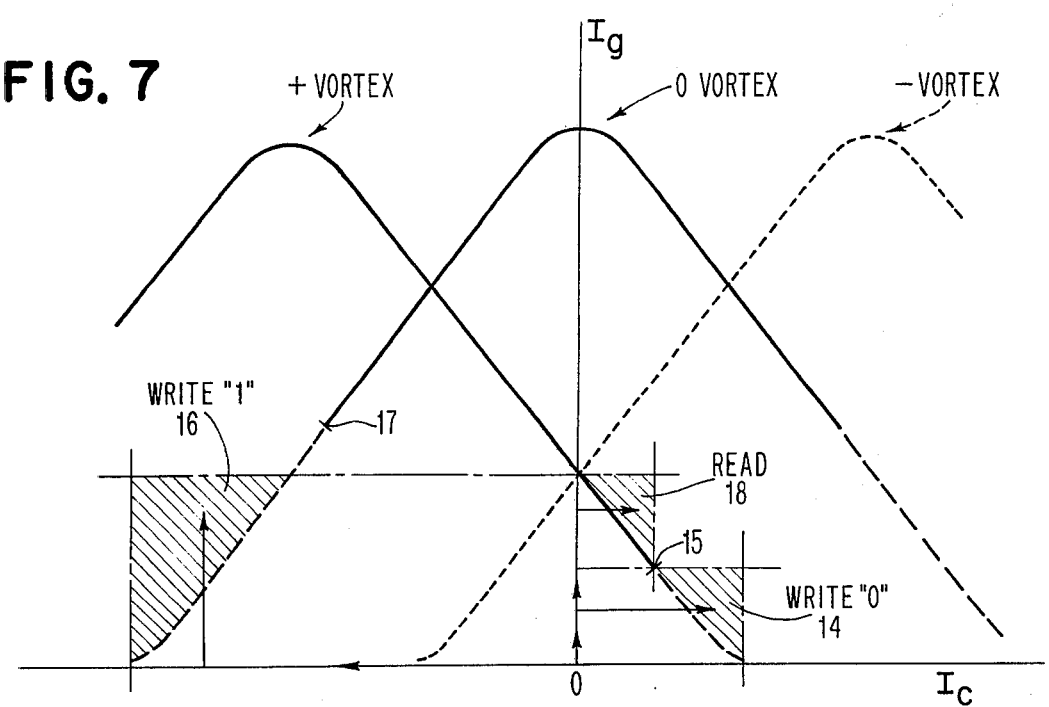
FIG. 7 shows a graphical representation of the ($I_g$) versus ($I_c$) characteristic for a device similar to that shown in FIG. 4A and further indicates writing and reading of the device by the application of coincident currents. The effect of reduced damping extends the gain characteristics of the modes shown to the extent that reading of both binary ones and binary zeros can be carried out unambiguously by coincident current selection. The solid line segments represent the switching threshold boundary while the dashed line segments represent the quantum state boundaries.

Referring now to FIG. 6, there is shown therein threshold curves of $I_g/I_0$ versus $I_c/I_0$ similar to those shown in FIG. 5 except that the curves shown are those for a device which exhibits large $R_j$ and consequently lower damping. The result of increasing the junction resistance, $R_j$, is to extend the heavy line portions of FIG. 5 such that the switching threshold of the device is extended as shown in FIG. 6. The extension of the switching threshold, as shown by the heavy lines in FIG. 6, when compared to the switching threshold of the device of FIG. 5, permits a crucial change in the operation of a device when it is being used as a memory element to store a single flux quantum at zero bias. This crucial change results from the extending of the switching thresholds of the device which is achieved by reducing the magnitude of the current density profile which, in turn, is achieved by providing a large junction resistance for a device having a desired current density profile. In FIG. 6, it should be noted that the critical point (that point where a combination of applied gate and control currents cause a device to switch into the voltage state) on the zero vortex curve is situated at $I_g/I_0 \sim 0.9$. As a result, if the threshold curve for a zero vortex or zero quantum state is crossed with gate current levels $I_g < 0.9\ I_0$, a positive vortex is formed without switching into the voltage state. Of course, at gate currents greater than $0.9\ I_0$, the device switches into the voltage state. In FIG. 6, it should also be noted that critical points on the positive and negative vortex threshold curves occur near $I_g/I_0 \sim 0.4$ so that switching to the voltage or $2\Delta$ state occurs at lower gate current levels. Thus, in terms of storing a single flux quantum, the writing of such information is little affected since switching between vortex thresholds or quantum states is still all that is required to store a binary one, for example, in a positive vortex or single flux quantum state. However, the reading of a device which is storing, for example, a binary one in the form of a positive vortex or single flux quantum state is now radically changed. Recalling that the vortex threshold curves of FIG. 5 which represent a device with low junction resistance, $R_j$, that reading unambiguously was achieved only by releasing a single flux quantum from the device by applying currents which crossed the positive vortex curve at a dashed line portion, it can be seen from a consideration of the threshold curves of FIG. 6 that reading a binary one which is stored in a device in the form of a single flux quantum can now be achieved by switching a device with low damping to the voltage state. Because of the extending of the switching thresholds, it is now possible using applied coincident gate and control currents to unambiguously detect the presence of either a binary one or a binary zero using the same values of coincident current to detect either state. FIG. 7 wherein the switching thresholds are superimposed on the vortex thresholds clearly shows the current conditions under which a device of low damping may be both written and read.

Referring now to FIG. 7, if a device represented by the curves of FIG. 7 is initially empty, a vortex will not be produced if the operating point remains inside the curve designated 0 vortex. For purposes of illustration, any combination of gate and control currents which are coincidentally applied to a device and its control line, respectively, which terminate in the shaded area 14 (otherwise identified as Write "0") may be utilized to write a binary zero. At this point, it should be appreciated that the curve designated — vortex in FIG. 7 may be used instead of the curve designated 0 vortex to both write and read a binary condition such as a binary 0 using the same currents described hereinbelow in connection with the 0 vortex curve. The upper bound of gate current which can be applied is, of course, determined by critical point 15 on the positive vortex curve which would come into play when it is desired to change from a binary one state represented by the positive vortex curve to a binary zero state. By applying currents which cross the positive vortex threshold curve only at a dashed portion, this change of states can be achieved without switching to the voltage state. To write a binary one, gate and control currents may be applied which extend into shaded area 16 (otherwise identified as Write "1") without crossing the heavy line area of a threshold curve. Again, shaded area 16 has an upper value of gate current which is determined by critical point 17 which would come into play in changing from a zero vortex state to a positive vortex state. Obviously, a gate current greater than 0.9 causes the switching threshold of the zero vortex curve to be crossed and the device to be switched into the voltage state.

With respect to reading, it is, of course, well known that the same coincident currents must be applied and that an unambiguous signal must be obtained for one of the two possible states of the device being read. As has been indicated hereinabove, when a device has large damping, it is not possible to obtain such an unambiguous signal for one of the two possible states being stored in the device by switching into the voltage state. Control of the junction resistance, $R_j$, to the extent that a device is provided with large junction resistance extends the switching threshold of such a device making it possible to obtain the desired unambiguous readout for a stored binary condition.

Again referring to FIG. 7, it should be clear that by applying the same values of gate and control currents an unambiguous switching to the voltage state can be obtained when a positive vortex is stored and no readout signal at all can be obtained using the same coincident currents when a zero vortex is stored. In FIG. 7, any combination of gate and control currents which brings the operating point of the device into shaded area 18 (otherwise labelled Read) causes the device to switch into the voltage $2\Delta$ state if a positive vortex is stored. Where a positive vortex is not stored, the threshold curve for a positive vortex does not exist and the very same applied coincident currents do not cause a crossing of a switching threshold and no output is obtained since the operating point of the device remains within the zero vortex curve which is the only one which exists when a zero vortex is stored in the device. As in the case of a single Josephson junction, when the presence of a positive vortex is sensed by the switching of the device to the $2\Delta$ or voltage state, the device remains in the voltage state as long as gate current is maintained. It should be appreciated that far more energy is available for sensing under these circumstances than when a single fluxoid was released using prior art reading approaches. Once all currents are removed from the device, the original information is lost, and the device may be in either of the three quantum states. Simulations and experimental results have shown that the limits of the switching threshold curves of FIG. 7 depend on device damping, which is, to the first order, determined by the low voltage single particle tunneling resistance, $R_j$, of a junction. The curves of FIG. 7 correspond, as previously indicated, to a device having low damping wherein the junction resistance, $R_j$, to provide the ability to read unambiguously should be $$\geq \sqrt{\frac{L}{4C}}$$

where $L$ is the inductance of the device and $C$ is the capacitance of the junction. Based on this relationship, it should be clear that the condition for the above read out scheme may also be controlled by changing either $L$ or $C$. Thus, for substantially fixed values of L and C, a small decrease in the thickness of the dielectric between superconducting elements increases the junction resistance, $R_j$. Also, for a fixed thickness of a dielectric between superconducting elements, a variation in L may be obtained by changing the depth of the notches shown in FIG. 2A–4A. The greater the depth of the notch, the greater is the constriction and the greater is the value of L. Another way to affect inductance is to change the superconductive penetration depth, $\lambda$, by changing the type of materials used, for example. In this instance the greater the penetration depth the greater is the inductance term L in the above relationship. The capacitance, C, may be changed by utilizing metals the oxides of which have larger dielectric constants, $\epsilon$. In general, as long as the above indicated inequality is preserved, the switching threshold curves are extended and it is irrelevant which of the parameters involved is changed.

Experimental devices having a shaped tunneling junction similar to that shown in FIG. 3A have been fabricated. A Josephson tunnel junction is formed between two lead alloy superconductors. The junction formed by a curvilinear notch in the extremity of the lower superconductor delineates one side of the device while an insulation layer of silicon oxide about 4000 A thick having a corresponding curvilinear notch extending toward the first mentioned delineates the other side of the junction. The final device has the shape of a butterfly or dumbbell. The inductance L which is predominantly determined by the central necked-down or constricted region was estimated to be approximately 0.5pH. While the experimental device did not utilize an orthogonal bit line, it was equipped with two longitudinal control lines. The control current was produced by feeding equal but opposite currents through these control lines. In the experimental device, the screening currents induced on top of the upper superconductive element produced a small current through the constriction. The information stored at an energy level of approximately $3 \times 10^{-18}$ joules showed remarkable stability despite unshielded conditions in a laboratory environment. Quasistatic writing and sensing with cycle times of 5 minutes have been demonstrated. The switching time of the present device is estimated to be 50ps. Writing was performed with triangular pulses having a base width approaching 1ns, and a sense cycle with similar pulses was also utilized.

Figure 8:
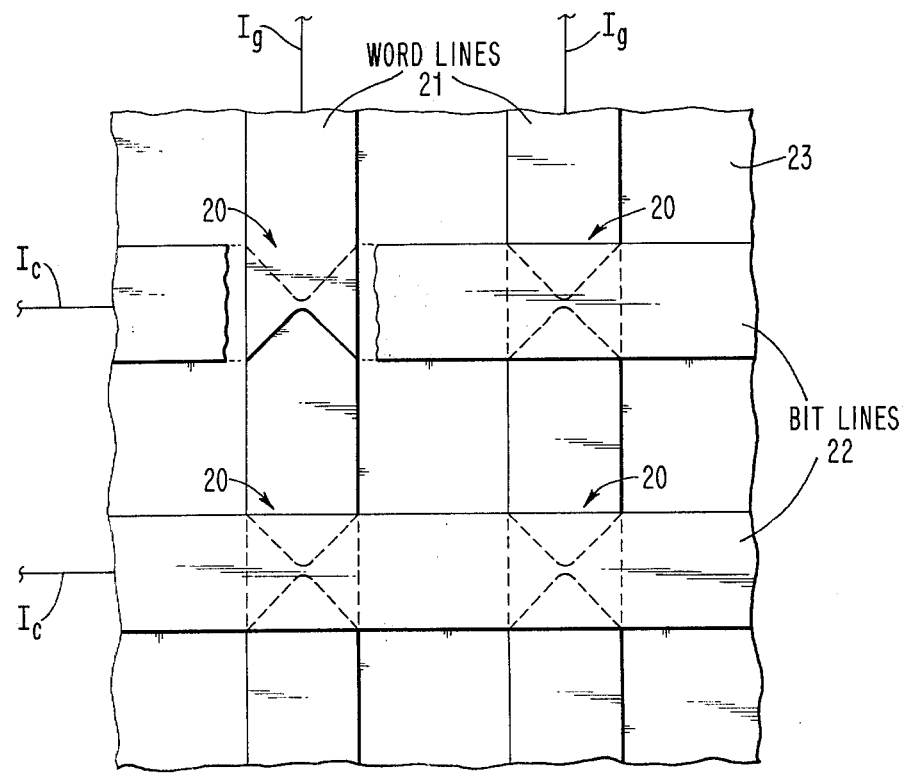
FIG. 8 shows an array of Josephson junction devices capable of storing a single flux quantum and providing low damping similar to that shown in FIG. 4A which are written and read by coincident current selection via word and bit lines.

Referring now to FIG. 8 a plan view of a portion of an array utilizing Josephson devices similar to that just described and identical with those shown in FIG. 3A is shown. Thus, FIG. 8 shows an array of four Josephson devices 20, pairs of which are connected in series via word lines 21. Bit lines 22 are disposed in orthogonal relationship with word lines 21 and are similar to control lines 5 shown in FIG. 1. The various elements are disposed on a ground plane 23 of niobium or other superconductive metal and are insulated therefrom by a layer of silicon oxide or other suitable dielectric. Current sources indicated in FIG. 8 by lines labelled $I_g$ and $I_c$, which are connected to word lines 21 and bit lines 22, respectively, provide coincident gate and control currents, respectively, which are utilized to store information in and read information from the array shown. Since each of the devices 20 has vortex modes and switching characteristics similar to those shown in FIG. 7, devices 20 can be both written and read by applying the proper coincident currents for writing a binary one or a binary zero and for reading out the stored information. While only four elements have been shown in a portion of an array, it should be appreciated that the present single flux quantum storage devices disclosed herein are particularly applicable to high density arrays which utilize a large number of devices 20.

While the teaching of the present application has been limited up until this point to single Josephson junction devices, it should be appreciated that interferometer devices well known to those skilled in the Josephson tunneling art and consisting of devices similar to that shown in FIG. 1 except that no tunneling occurs in centrally disposed region 9 may also be utilized in the practice of the present invention to the extent that increasing the junction resistance of both Josephson junctions of the interferometer can also extend the switching threshold characteristics of that device in a manner similar to that described in connection with FIG. 6 hereinabove. Thus, an interferometer may be utilized in a regime wherein a single flux quantum is stored and wherein unambiguous coincident current readout is possible in the same way as described hereinabove in connection with FIG. 7. Thus, the Josephson current density profile of an interferometer is similar to that shown for the devices of FIG. 1 and FIGS. 2A–4A except that the magnitude in the centrally disposed region between the pair of Josephson junctions is zero. The profile at its boundaries may be reduced to increase the junction resistance to provide reduced damping and may be accomplished by increasing the thickness of the dielectric in the same manner described in connection with FIG. 1 hereinabove. Of course, in any event, the dielectric thickness should not be so great as to prevent Josephson tunneling across the dielectric. Also, the junction resistance, $R_j$, should adhere to the criterion that it be $$\geq \sqrt{\frac{L}{4C}};$$

it being understood that $L$ and $C$ may be varied as discussed hereinabove to adjust the junction resistance. Finally, the interferometer device may be read and written in a manner similar to that described hereinabove in connection with FIG. 7.

While the invention has been particularly shown with reference to preferred embodiments thereof, it will be understood by those skilled in the art that the foregoing and other changes in form and details may be made therein without departing from the spirit and scope of the invention.

What is claimed is:

1. A Josephson junction device for storing single flux quantum in the absence of an external magnetic field comprising
   first and second superconductive elements,
   an insulation layer the thickness of which is sufficient to permit Josephson tunneling along the length thereof disposed between said elements, and
   means integral with at least one of said elements and said layer for generating a current density profile having a larger magnitude at the boundary portions of said device than at the center portion of said device.

2. A Josephson junction device according to claim 1 further including means integral with said device for changing the magnitude of said current density profile to reduce the damping of said device.

3. A Josephson junction device according to claim 1 further including
   means disposed in electrically coupled relationship with said device for storing information therein.

4. A Josephson junction device according to claim 1 wherein said means for generating said current density profile includes portions of reduced thickness in said insulation layer coincident with said boundary portions.

5. A Josephson junction device according to claim 1 wherein said means for generating said current density profile includes portions of said first and second elements coincident with said boundary portions having work functions different from the work functions of said elements at said center portion.

6. A Josephson junction device according to claim 1 wherein said means for generating said current density profile includes portions of said first and second elements coincident with said boundary portions having work functions lower than the work functions of said elements at their center portion.

7. A Josephson junction device according to claim 1 wherein said means for generating said current density profile includes a portion of each of said elements disposed in overlapping relationship at least a portion of the extremity of at least one of said elements extending toward the other to provide a narrower tunneling region at the center of said device than at the boundaries of said device.

8. A Josephson junction device according to claim 2 wherein said means integral with said device for changing the magnitude of said profile includes means for increasing the junction resistance, $R_j$, of said device to reduce the damping of said device.

9. A Josephson junction device according to claim 2 wherein said means for generating said current density profile includes portions of reduced thickness in said insulation layer coincident with said boundary portions.

10. A Josephson junction device according to claim 2 wherein said means for generating said current density profile includes portions of said first and second elements coincident with said boundary portions having work functions different from the work functions of said elements at said center portion.

11. A Josephson junction device according to claim 2 wherein said means for generating said current density profile includes portions of said first and second elements coincident with said boundary portions having work functions lower than the work functions of said elements at their center portion.

12. A Josephson junction device according to claim 2 wherein said means for generating said current density profile includes a portion of each of said elements disposed in overlapping relationship with at least a portion of the extremity of at least one of said elements extending toward the other to provide a narrower tunneling region at the center of said device than at the boundaries of said device.

13. A Josephson junction device according to claim 2 further including means disposed in electrically coupled relationship with said device for storing information therein.

14. A Josephson junction device according to claim 2 further including means disposed in electrically coupled relationship with said device for reading information stored therein.

15. A Josephson junction device according to claim 3 wherein said means for storing includes at least a single control element disposed in overlying relationship with said device and means coupled to said device and said control element for applying coincident gate and control currents, respectively, to said device and said control element.

16. A Josephson junction device according to claim 7 wherein said at least a portion of the extremity of at least one of said elements extending toward the other forms at least a single tapered notch.

17. A Josephson junction device according to claim 7 wherein said at least a portion of the extremity of at least one of said elements extending toward the other forms at least a single rectilinear notch.

18. A Josephson junction device according to claim 7 wherein said at least a portion of the extremity of at least one of said elements extending toward the other forms at least a single curvilinear notch.

19. A Josephson junction device according to claim 7 wherein said at least a portion of the extremity of at least one of said elements extending toward the other forms a centrally disposed necked down region.

20. A Josephson junction device according to claim 8 wherein said means for increasing the junction resistance includes said insulation layer all portions of which are of a thickness greater than said first mentioned thickness, said greater thickness being such that Josephson tunneling occurs along the length of said junction in accordance with $J_1(x)$ but is of decreased magnitude everywhere along the length of said junction.

21. A Josephson junction device according to claim 8 wherein the value of said junction resistance is defined by $$R_j \geq \sqrt{\frac{L}{4C}},$$

where $L$ is the inductance of said device, and, $C$ is the capacitance of the junction.

22. A Josephson junction device according to claim 12 wherein said at least a portion of the extremity of said at least one of said elements extending toward the other forms at least a single tapered notch.

23. A Josephson junction device according to claim 12 wherein said at least a portion of the extremity of said at least one of said elements extending toward the other forms at least a single rectilinear notch.

24. A Josephson junction device according to claim 12 wherein said at least a portion of the extremity of said at least one of said elements extending toward the other forms at least a single curvilinear notch.

25. A Josephson junction device according to claim 12 wherein said at least a portion of the extremity of said at least one of said elements extending toward the other forms a centrally disposed necked down region.

26. A Josephson junction device according to claim 13 wherein said means for storing includes at least a single control element disposed in overlying relationship with said device and means coupled to said device and said control element for applying coincident gate and control currents, respectively, to said device and said control element.

27. A Josephson junction device according to claim 14 wherein said means for reading includes at least a single control element disposed in overlying relationship with said device and means coupled to said device and said control element for applying coincident gate and control currents, respectively, to said device and said control element.

28. A Josephson junction device according to claim 14 wherein said means for reading includes at least a single control element disposed in overlying relationship with said device and means connected to said device and said control element for switching said device to the voltage state for one stored binary condition and for maintaining said device in an unchanged state for another stored binary condition.

29. A Josephson junction device according to claim 15 wherein said means for applying coincident gate and control currents includes sources connected to said device and said control element, the current magnitudes and polarities of which, to write a binary zero in the absence of a stored binary one, are insufficient to change said device from a zero vortex mode to a one vortex mode and, in the presence of a stored binary one are sufficient to change said device from a one vortex mode to a zero vortex mode, and the current magnitudes and polarities of which to write a binary one in the absence of a stored binary one are sufficient to change said device from a zero vortex mode to a one vortex mode, and, in the presence of a stored binary one are insufficient to change said device from a one vortex mode to a zero vortex mode.

30. A Josephson junction device according to claim 26 wherein said means for applying coincident gate and control currents includes sources connected to said device and said control element, the current magnitudes and polarities of which, to write a binary zero in the absence of a stored binary one, are insufficient to change said device from a zero vortex mode to a one vortex mode and, in the presence of a stored binary one are sufficient to change said device from a one vortex mode to a zero vortex mode, and the current magnitudes and polarities of which to write a binary one in the absence of a stored binary one are sufficient to change said device from a zero vortex mode to a one vortex mode, and, in the presence of a stored binary one are insufficient to change said device from a one vortex mode to a zero vortex mode.

31. A Josephson junction device according to claim 27 wherein said means connected to said device and said control element include sources connected to said device and said control elements, the current magnitudes and polarities of which, to read one binary condition, are insufficient to change the condition of said device, and, to read another binary condition, are sufficient to switch said device into the voltage state.

32. A Josephson junction device for storing binary information including an interferometer device having at least two spaced apart junctions capable of carrying Josephson current the improvement comprising means disposed in electrically coupled relationship with said device for switching said device to the voltage state in response to the presence of one of two stored binary conditions.

33. A Josephson junction device according to claim 32 further including means disposed in electrically coupled relationship with said device for storing information therein.

34. A Josephson junction device according to claim 33 wherein said means for storing includes at least a single control element disposed in overlying relationship with said device and means coupled to said device and said control element for applying coincident gate and control currents, respectively, to said device and said control element.

35. A Josephson junction device according to claim 32 wherein said means for switching includes at least a single control element disposed in overlying relationship with said device and means coupled to said device and said control element for applying coincident gate and control currents, respectively, to said device and said control element.

36. A Josephson junction device according to claim 34 wherein said means for applying coincident gate and control currents includes current sources connected to said device and said control element, the current magnitudes and polarities of which, to write a binary zero in the absence of a stored binary one, are insufficient to change said device from a zero vortex mode to a one vortex mode and, in the presence of a stored binary one are sufficient to change said device from a one vortex mode to a zero vortex mode, and the current magnitudes and polarities of which to write a binary one in the absence of a stored binary one are sufficient to change said device from a zero vortex mode to a one vortex mode, and, in the presence of a stored binary one are insufficient to change said device from a one vortex mode to a zero vortex mode.

37. A Josephson junction device according to claim 35 wherein said means connected to said device and said control element include current sources connected to said device and said control elements, the current magnitudes and polarities of which, to read one binary condition, are insufficient to change the condition of said device, and, to read another binary condition, are sufficient to switch said device into the voltage state.

38. A Josephson junction device for storing a single flux quantum comprising:
first and second superconductive elements,
an insulation layer the thickness of which is sufficient to permit Josephson tunneling along the length thereof disposed between said elements forming a single junction, the gain characteristic, $I_g$ versus $I_c$, of which has a region of overlap of at least two of its vortex modes, one of said modes, representing a binary one and another of said modes representing a binary zero, and means integral with at least one of said elements and said layer for causing said region of overlap to encompass the $I_g = I_c = 0$ point of said gain characteristic in the absence of an external magnetic field wherein $I_g$ is the gate current and $I_c$ is the control current.

39. A Josephson junction device according to claim 38 further including means disposed in electrically coupled relationship with said device for storing information therein.

40. A Josephson junction device according to claim 38 further including means integral with said device for reducing the damping of said device.

41. A Josephson junction device according to claim 40 further including means disposed in electrically coupled relationship with said device for storing information therein.

42. A Josephson device according to claim 40 further including means disposed in electrically coupled relationship with said device for reading information stored therein.

43. A Josephson device according to claim 40 wherein said means for reducing the damping includes means for increasing the junction resistance, $R_j$, of said device.

44. A Josephson device according to claim 42 wherein said means for reading includes at least a single control element disposed in overlying relationship with said device and means coupled to said device and control element for applying coincident gate and control currents, respectively, to said device and said control element.

45. A Josephson junction device according to claim 44 wherein said means connected to said device and said control element include sources connected to said device and said control elements, the current magnitudes and polarities of which, to read one binary condition, are insufficient to change the condition of said device, and, to read another binary condition, are sufficient to switch said device into the voltage state.

* * * * *